United States Patent [19]
Johnson

[11] Patent Number: 5,541,121
[45] Date of Patent: Jul. 30, 1996

[54] REDUCED RESISTANCE BASE CONTACT METHOD FOR SINGLE POLYSILICON BIPOLAR TRANSISTORS USING EXTRINSIC BASE DIFFUSION FROM A DIFFUSION SOURCE DIELECTRIC LAYER

[75] Inventor: F. Scott Johnson, Plano, Tex.

[73] Assignee: Texas Instruments Incorporated, Dallas, Tex.

[21] Appl. No.: 380,906

[22] Filed: Jan. 30, 1995

[51] Int. Cl.$^6$ ............................................. H01L 21/265
[52] U.S. Cl. .......................... 437/31; 437/162; 437/164; 437/909; 148/DIG. 10
[58] Field of Search ............................ 437/31, 162, 160, 437/164, 909; 148/DIG. 10, DIG. 11

[56] References Cited

U.S. PATENT DOCUMENTS

| | | | |
|---|---|---|---|
| 4,006,046 | 2/1977 | Pravin | 437/164 |
| 5,086,016 | 2/1992 | Brodsky et al. | 437/160 |
| 5,234,846 | 8/1993 | Chu et al. | 437/31 |
| 5,385,850 | 1/1995 | Chu et al. | 437/160 |
| 5,480,816 | 1/1996 | Uga et al. | 437/164 |

FOREIGN PATENT DOCUMENTS

| | | | |
|---|---|---|---|
| 0069273 | 6/1977 | Japan | 437/164 |
| 0008818 | 3/1980 | Japan | 437/164 |

OTHER PUBLICATIONS

Kiyotaka Imai, Yasushi Kinoshita, Toru Yamazaki, Toru Tatsumi and Tsutomu Tashiro; "A Low Donor Concentration Retrograde Profile Si Bipolar Transistor For Low–Temperature BiCMOS LSI's"; 1994 Symposium on VLSI Technology Digest of Technical Papers; pp. 159–160.

V. dela Torre, J. Foerstner, B. Lojek, K. Sakamoto, S. L. Sundaram, N. Tracht, B. Vasquez and P. Zdebel; "MOSAIC V—Very High Performance BiPolar Technology"; IEEE 1991 BiPolar Circuits and Technology Meeting 1.3.

M. Sugiyama, H. Takemura, C. Ogawa, T. Tashiro, T. Morikawa and M. Nakamae; "A 40 GHz $f_T$ Si BiPolar Transistor LSI Technology"; 1989 IEEE, IEDM 89, pp. 221–224.

H. Takemura, S. Ohi, M. Sugiyama, T. Tashiro and M. Nakamae; "BSA Technology for Sub–100 nm Deep Base BiPolar Transistors"; 1987 IEEE, IEDM 87, pp. 375–378.

F. S. Johnson, G. S. Harris, J. J. Wortman, and M. C. Ozturk; "Self Aligned BJTs For Using New Diffusion For Shallow Base Formation"; 51st Annual Device Research Conference Santa Barbara, (1993), pp. 173–174.

F. Scott Johnson, Veena Misra, and J. J. Wortman, *North Carolina State University, Department of Electrical and Computer Engineering;* Leanne R. Martin, Gari A. Harris, and Dennis M. Maher, *North Carolina State University, Department of Materials Science and Engineering;* "Selective Removal of Silicon–Germanium Chemical and Reactive Ion Etching"; Materials Research Society, Spring Symposium May, 1993, pp. 147–152.

*Primary Examiner*—Tuan H. Nguyen
*Attorney, Agent, or Firm*—Jacqueline J. Garner; Jim Brady; Richard L. Donaldson

[57] ABSTRACT

A bipolar transistor (100) and a method for forming the same. A diffusion source dielectric layer (118) is deposited over a semiconductor body (101). An emitter window (116) is then etched through the diffusion source dielectric layer (118). An extrinsic base region (110) is diffused from the diffusion source dielectric layer (118). The intrinsic base region (108) is then implanted. Base-emitter spacers (120) are then formed followed by the emitter electrode (124) and emitter region (126). The extrinsic base region (110) is self-aligned to the emitter eliminating the alignment tolerances for the lateral diffusion of the extrinsic base implant and an extrinsic base implant.

14 Claims, 4 Drawing Sheets

REDUCED RESISTANCE BASE CONTACT METHOD FOR SINGLE POLYSILICON BIPOLAR TRANSISTORS USING EXTRINSIC BASE DIFFUSION FROM A DIFFUSION SOURCE DIELECTRIC LAYER

FIELD OF THE INVENTION

This invention generally relates to semiconductor structures and processes and more specifically bipolar transistors.

BACKGROUND OF THE INVENTION

Bipolar transistors (BJTs) are commonly used in semiconductor devices especially for high speed operation and large drive current applications. A single polysilicon BJT 10 is shown in FIGS. 1a–b. The area for the BJT 10 is isolated by field oxides 12. The collector 14 is a lightly doped epitaxial layer of one conductivity type and the base region is formed by doped regions 16 and 18 of the opposite conductivity type. Doped region 16 is called the intrinsic base region and region 18 is the extrinsic base region. The extrinsic base region 18 provides an area for connecting to the base region. The emitter region 22 is a doped region of the same conductivity type as the collector and is located within the intrinsic base region 16. The emitter electrode 24 is accomplished with a doped polysilicon layer. Emitter dielectric layer 26 isolates the emitter electrode 24 from the base regions 16 and 18. Both the extrinsic base regions 18 and the emitter electrode 24 are silicided to reduce resistivity. Thus, there is a silicide contact 30 over the extrinsic base regions 18. Single polysilicon BJTs can be fabricated with a less complex process than double polysilicon BJTs. However, they typically have the disadvantage of higher base resistance and increased extrinsic capacitances over double polysilicon BJTs.

The BJT of FIG. 1 is typically formed by forming a screen oxide over the silicon active area and implanting a base region. The screen oxide is then thickened to form emitter dielectric layer 26. Next, an opening is etched in the emitter dielectric layer 26. A thicker emitter dielectric is desired to reduce polysilicon emitter capacitance. However, because the base is implanted before the emitter pattern, etching the emitter dielectric can result in an overetch that varies device parameters if a thick emitter dielectric is used. Next, the emitter electrode 24 and emitter region 22 are formed. The emitter electrode 24 is patterned with over two alignment tolerances. Alignment tolerances need to account for the alignment of the emitter electrode to the emitter, the lateral diffusion of the extrinsic base implant and the alignment tolerance for the extrinsic base implant. Accordingly, the emitter electrode 24 can extend greater than 0.5 µm over the emitter dielectric 26 layer as shown in FIG. 1. The extrinsic base regions 18 are then implanted, diffused, and subsequently silicided. However, the base link-up distance 32 dominates the base resistance. The base link-up distance 32 is determined by the size of the emitter electrode 24. As discussed above, the size of the emitter electrode 24 is determined by the amount of alignment tolerances necessary. This requires a double sided base contact 30 for low resistance, limits the minimum device area, and requires deeper extrinsic base region 18 to prevent punch-through of the junction corner when siliciding the base contacts. It also reduces Fmax (the unity power gain frequency), limits high current operation and increases amplifier noise in low impedance amplifiers. Accordingly, there is a need for a BJT that overcomes the above problems.

SUMMARY OF THE INVENTION

A bipolar transistor and a method for forming the same are disclosed herein. A diffusion source dielectric layer is deposited over a semiconductor body. An emitter window is then etched through the diffusion source dielectric layer. An extrinsic base region is diffused from the diffusion source dielectric layer. The intrinsic base region is then implanted in the emitter window. Base-emitter spacers are then formed followed by the emitter electrode and emitter region. The extrinsic base region is selfaligned to the emitter eliminating the alignment tolerances for the lateral diffusion of the extrinsic base implant and an extrinsic base implant.

An advantage of the invention is providing a method of forming a bipolar transistor having reduced base resistance.

A further advantage of the invention is providing a method of forming a bipolar transistor that allows for a smaller device area.

A further advantage of the invention is providing a method of forming a bipolar transistor that allows for a shallower extrinsic base region.

These and other advantages will be apparent to those skilled in the art having reference to the specification in conjunction with the drawings.

BRIEF DESCRIPTION OF THE DRAWINGS

In the drawings.

Corresponding numerals and symbols in the different figures refer to corresponding parts unless otherwise indicated.

DETAILED DESCRIPTION OF PREFERRED EMBODIMENTS

The invention will now be described in conjunction with a single polysilicon bipolar transistor (BJT) formed using a BiCMOS process. It will be apparent to those skilled in the art that the invention is also applicable to other BiCMOS processes and devices as well as to bipolar processes and devices.

Figure 1A:
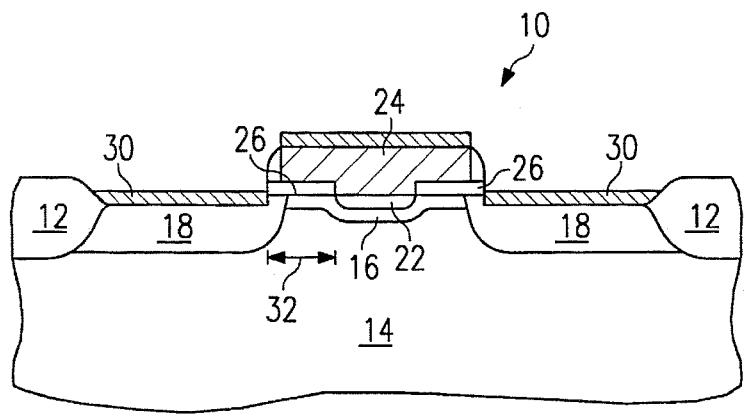
FIGS. 1a–b are cross-sectional and layout diagrams respectively of a prior art BJT.
Figure 1B:
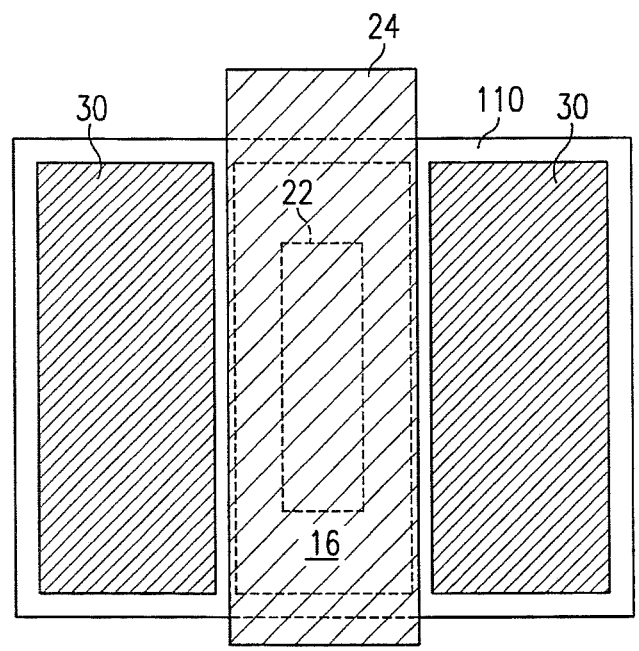
Figure 2:
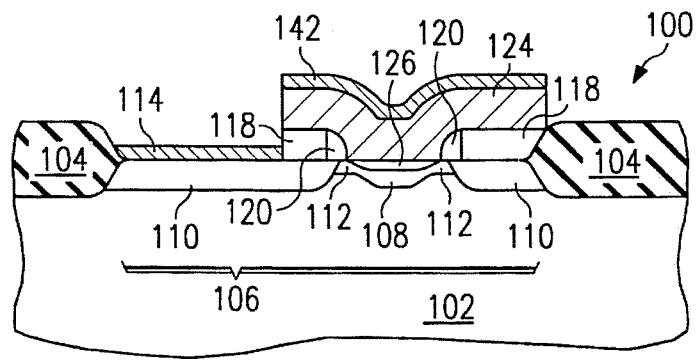
FIG. 2 is a cross-sectional diagram of a BJT according to the invention.

A BJT 100 according to the invention is shown in FIG. 2. Field insulating regions 104 isolate BJT 100 from other devices (not shown), such as other BJTs, MOS transistors, diodes and resistors, etc. Region 102 is a collector region. Many suitable collector regions are well known in the art. For example, collector region 102 may comprise a buried collector and a lightly doped epitaxial layer such as that described in U.S. Pat. No. 4,958,213, issued Sep. 18, 1990 and assigned to Texas Instruments, Inc.

The base region 106 consists of an intrinsic base region 108 and an extrinsic base region 110. Intrinsic base region 108 is the region into which the emitter region is located. Extrinsic base region 110 provides an area for connection to the base region 106. Extrinsic base region 110 is self-aligned to the emitter. The area of intrinsic base region 108 between the ends of the emitter region and the ends of the extrinsic base region 110 is called the base link-up region 112. In prior art designs the base link-up region was significantly longer than that of BJT 100. The length of the base link-up region dominated the base resistance in the prior art. The intrinsic and extrinsic base regions (108 and 110) have the same conductivity type. For example, of the collector region 102 is n-type, the base regions 108 and 110 are p-type. Alternatively, if the collector region 102 is p-type, the base regions 108 and 110 are n-type.

Due to the fact that the base link-up region 112 is narrow and that the extrinsic base region is a low resistance region, contact to the base region 106 need only be done on one side of the intrinsic base region 108, as shown in FIG. 2. A single-side contact 114 requires less area and allows for a smaller device. Of course, a traditional double sided contact may alternatively be used.

Diffusion source dielectric layer 118 is located between emitter electrode and extrinsic base region 110. Layer 118 comprises a dielectric material that is capable of acting as a dopant source for n-type and/or p-type dopants and may be selectively etched with respect to silicon. It should also be compatible with conventional semiconductor processing. Examples include silicate glass such as borosilicate glass (BSG) and phosphosilicate glass (PSG). Diffusion source dielectric layer 118 may also comprise several layers of material such as an oxide/silicon germanium stack or a silicon nitride/BSG stack as long as the above criteria remain satisfied.

Base-emitter spacers 120 provide the spacing between the ends of the emitter region 126 and the ends of the intrinsic base region 108. In addition, the combination of base-emitter spacers 120 and diffusion source dielectric layer 118 isolate the emitter electrode 124 from the extrinsic base region 110. Emitter electrode 124 preferably comprises doped polysilicon and is the dopant source for emitter region 126. Emitter electrode 124 is preferably silicided to reduce resistivity.

Figure 3:
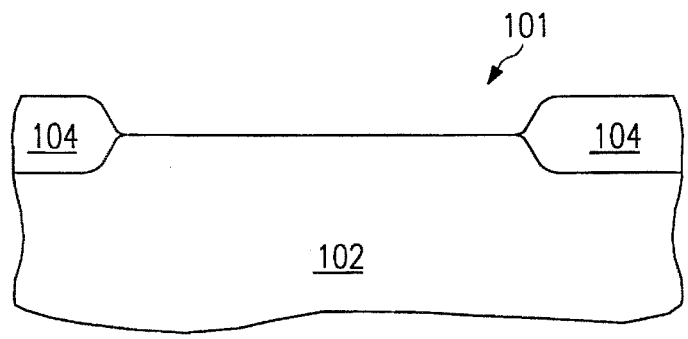
FIGS. 3–7 are cross-sectional diagrams of the BJT of FIG. 2 at various stages of fabrication.

FIG. 3 illustrates a semiconductor body 10 1 after the formation of collector region 102 and field insulating regions 104. Collector region 102 may comprise a buried layer, an epitaxial layer and a deep N+collector sink as is well known in the art. The formation of a BJT 100 according to the invention into the structure of FIG. 3 will now be described.

Figure 4:
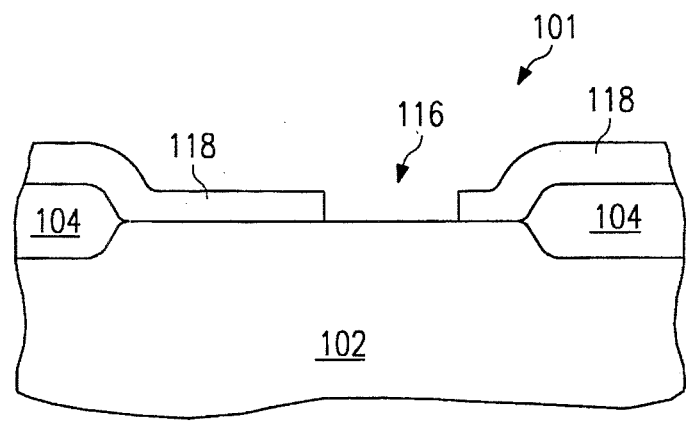

Referring to FIG. 4, a diffusion source dielectric layer 118 is deposited over the surface of semiconductor body 101. As discussed above, layer 118 comprises a dielectric material that can provide a controllable dopant source of n-type or p-type dopants for diffusion into semiconductor body 101. Layer 118 is also able to be selectively etched with respect to silicon in order to avoid damaging semiconductor body 101 during an etch of diffusion source dielectric layer 118. For this reason and the fact that base region 108 has not yet been implanted, layer 118 may be as thick as desired. For example, layer 118 may comprise a silicate glass such as BSG or PSG and have thickness on the order of 4 kA or larger. Layer 118 is then patterned and etched to expose emitter window 116. The etch is preferably highly selective to silicon so as to avoid damaging the surface of semiconductor body 101.

Figure 5:
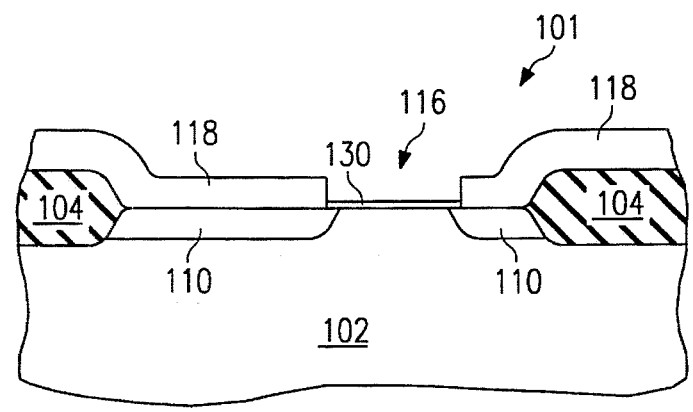

Next, a screen oxide 130 is formed in emitter window 116 and extrinsic base region 110 is diffused from diffusion source dielectric layer 118. Screen oxide 130 is preferably thermally grown to a thickness on the order of 100 Å. During the growth of screen oxide 130, dopants diffuse from diffusion source dielectric layer 118 into semiconductor body 101 to form extrinsic base region 110. This is illustrated in FIG. 5. Because extrinsic base region 110 is diffused from diffusion source dielectric layer 118 which will also serve as the emitter dielectric, extrinsic base region 110 is self-aligned to the emitter. This eliminates alignment tolerances and allows the overall BJT 100 to require less area.

Figure 6:
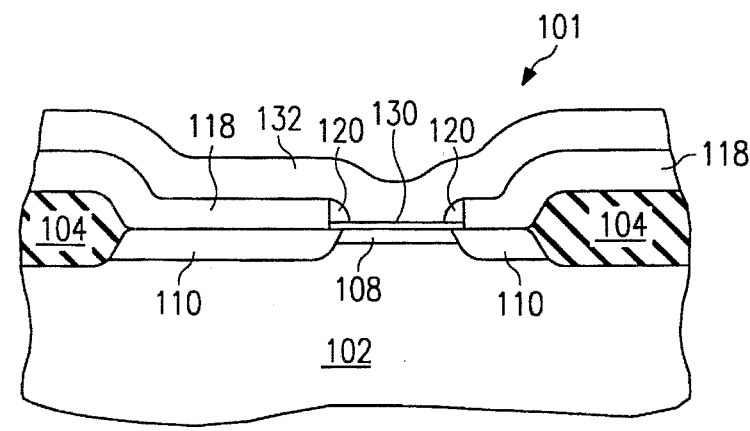
Figure 7:
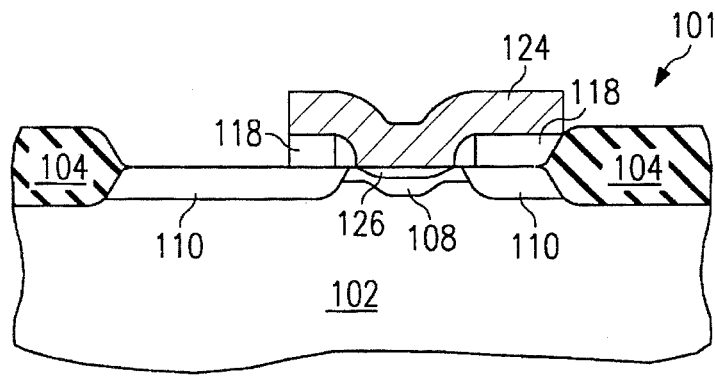

Referring to FIG. 6, intrinsic base region 108 is implanted through screen oxide 130. Base-emitter spacers 120 are then formed to space the edges of a subsequently formed emitter region from the intrinsic base region edges. Base-emitter spacers 120 may comprise, for example, silicon-dioxide. A layer of polysilicon 132 is then deposited to thickness on the order of 2500 Å. Polysilicon layer 132 may be doped in-situ or implant doped after deposition. Finally, the polysilicon layer 132 along with diffusion source dielectric layer 118 is patterned and etched to form the emitter electrode 124 as shown in FIG. 7. The etch used for diffusion source dielectric layer 118 is highly selective to silicon to avoid damage to extrinsic base region 110. The emitter region 126 is diffused from the second polysilicon layer/emitter electrode either prior to or subsequent to the polysilicon etch.

Figure 8A:
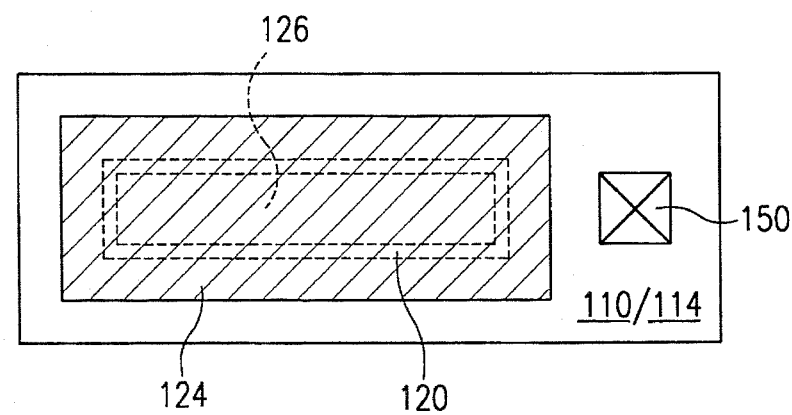
FIGS. 8a–d are exemplary layout diagrams of the BJT of FIG. 2.
Figure 8B:
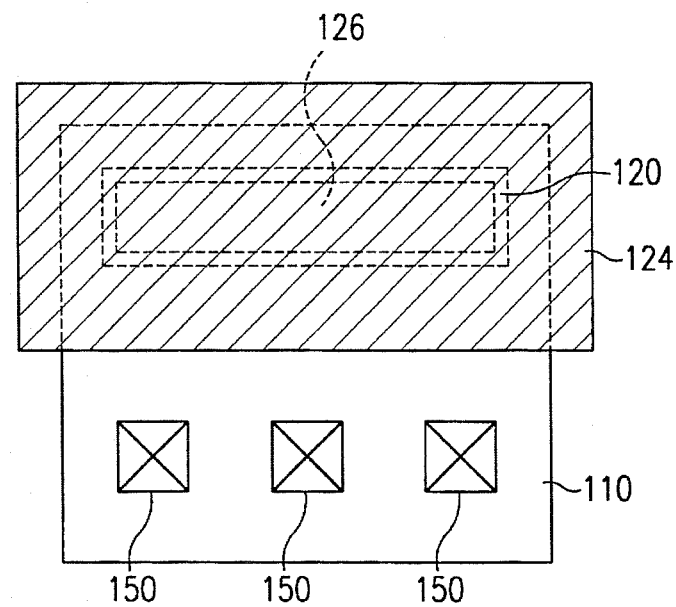
Figure 8C:
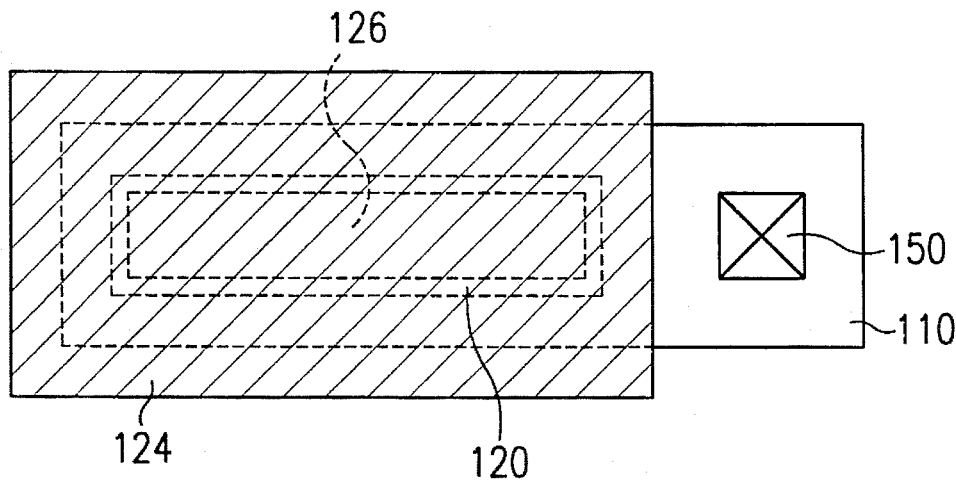
Figure 8D:
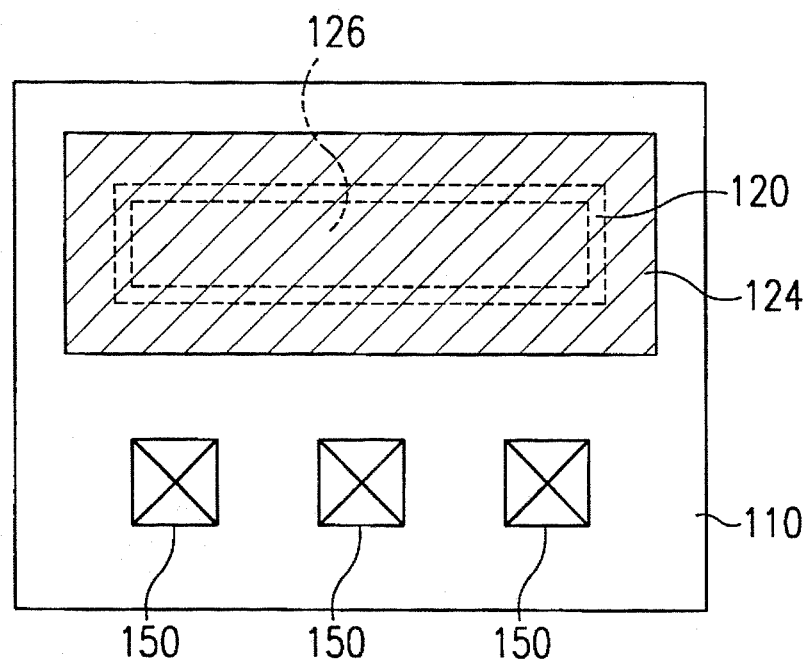

Because extrinsic base region 110 is self-aligned to the emitter, several alignment factors are eliminated allowing for a smaller device area. The emitter electrode 124 has a minimum overlap of only one alignment tolerance, that of the emitter electrode 124 to the emitter region 122. Thus, the minimum overlap may be on the order of 0.2 μm. The presence of a self-aligned extrinsic base region of low resistance allows for single side contact to the base region 106 as shown in FIGS. 8a–d. This further reduces the device area. Of course, if desired, a double side contact may still be used. FIG. 8a illustrates one exemplary layout of BJT 100 having a single base contact 150 on a short side of the device. The base region 110 extends passed the emitter electrode 124 allowing for the formation of a silicide strip 114 over the exposed base region encircling the device. FIG. 8b illustrates another exemplary layout view of BJT 100 having several base contacts 150 on a long side of the device. In this embodiment, the base region 110 extends passed the emitter electrode 124 only on the side where the base contacts 150 are formed. FIG. 8c is similar to FIG. 8a except that the extrinsic base region 110 only extends passed the emitter electrode 124 on one side and FIG. 8d is similar to FIG. 8b except that the extrinsic base region 110 extends passed the emitter electrode 124 on all sides to allow for the formation of silicide encircling the device.

Finally, the exposed portion of the extrinsic base region 110 and emitter electrode 124 are preferably silicided according to conventional means. For example, a layer of refractory metal, such as titanium or cobalt, may be deposited using sputter deposition on the surface of semiconductor body 101. A self-aligned silicide or "SALICIDE" process may then be performed which involves using a rapid thermal anneal or furnace anneal, in a nitrogen-containing atmosphere. Silicide is formed by the reaction of refractory metal layer with silicon. Where no silicon is present, the refractory metal layer reacts with the nitrogen atmosphere to form titanium-nitride (TiN). Some unreacted titanium (not shown) may also remain on these surfaces. The reaction of refractory metal layer with polysilicon emitter electrode 124 forms a layer of silicide 142 and the reaction of refractory metal with extrinsic base region 110 forms silicide base contact 114. Finally, the TiN layer, as well as any unreacted titanium, is removed using a selective etch such as a megasonic (or $H_2O_2:H_2O$) etch.

The self-aligned extrinsic base region diffusion prevents silicide punch-through of the junction corner. In prior art designs, the extrinsic base region needed to be diffused deep enough to provide sufficient lateral diffusion to avoid silicide punch-through at the junction corner. However, in BJT 100, the self-aligned extrinsic base has sufficient lateral spacing to the silicide contact 114 without the necessity of a deeper region. Accordingly, the extrinsic base region may be as shallow as desired without regard to lateral diffusion. As an example, the depth may be on the order of less than 2 k Å.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method for forming a bipolar transistor in a semiconductor substrate, comprising the steps of:

forming a collector region in said semiconductor substrate;

depositing a diffusion source dielectric layer over said collector region;

etching an emitter window in said diffusion source dielectric layer;

diffusing an extrinsic base region in said collector region from said diffusion source dielectric layer;

implanting an intrinsic base region in said collector region through said emitter window; and forming an emitter electrode in said emitter window and an emitter region in said intrinsic base region, said extrinsic base region being self-aligned to said emitter region.

2. The method of claim 1 wherein said diffusion source dielectric layer comprises silicate glass.

3. The method of claim 1 wherein said diffusion source dielectric layer comprises a layer of silicon nitride over a layer of silicate glass.

4. The method of claim 1 wherein said diffusion source dielectric layer comprises a layer of oxide over a layer of silicon germanium.

5. The method of claim 1, wherein said step of diffusing said extrinsic base region includes the step of forming a screen oxide layer in said emitter window and wherein said intrinsic base region is implanted through said screen oxide.

6. The method of claim 1, further comprising the step of siliciding said emitter electrode and forming a silicide contact over said extrinsic base region, said silicide contact being self-aligned to said emitter electrode.

7. The method of claim 6, wherein said silicide contact is formed on only one side of said extrinsic base region.

8. A method of forming a single polysilicon bipolar transistor comprising the steps of:

forming a collector region in a semiconductor body;

depositing a diffusion source dielectric layer over said collector region;

etching an emitter window in said diffusion source dielectric layer;

forming a screen oxide layer in said emitter window and diffusing an extrinsic base region from said diffusion source dielectric layer;

implanting an intrinsic base region through said screen oxide layer;

forming base-emitter spacers in said emitter window; and forming an emitter electrode in said emitter window and an emitter region in said intrinsic base region, wherein said extrinsic base region is self-aligned to said emitter region.

9. The method of claim 8, wherein said emitter electrode extends less than 0.5 microns over at least one side of said diffusion source dielectric layer.

10. The method of claim 8 wherein said diffusion source dielectric layer comprises silicate glass.

11. The method of claim 8 wherein said diffusion source dielectric layer comprises a layer of silicon nitride over a layer of silicate glass.

12. The method of claim 8 wherein said diffusion source dielectric layer comprises a layer of oxide over a layer of silicon germanium.

13. The method of claim 8, further comprising the step of siliciding said emitter electrode and forming a silicide contact over said extrinsic base region.

14. The method of claim 13, wherein said silicide contact is formed on only one side of said extrinsic base region.

* * * * *